United States Patent [19]

Chang

[11] 4,300,989
[45] *Nov. 17, 1981

[54] FLUORINE ENHANCED PLASMA GROWTH OF NATIVE LAYERS ON SILICON

[75] Inventor: Robert P. H. Chang, Warren, N.J.

[73] Assignee: Bell Telephone Laboratories, Incorporated, Murray Hill, N.J.

[*] Notice: The portion of the term of this patent subsequent to Jan. 20, 1998, has been disclaimed.

[21] Appl. No.: 81,353

[22] Filed: Oct. 3, 1979

[51] Int. Cl.$^3$ .................. H01L 21/316; C01B 33/12; B05D 3/06
[52] U.S. Cl. .................................. 204/164; 423/335; 427/38; 427/82
[58] Field of Search ............... 204/164; 423/335, 344; 427/38, 82

[56] References Cited

U.S. PATENT DOCUMENTS

| | | | |
|---|---|---|---|
| 3,692,571 | 9/1972 | Colton et al. | 427/93 |
| 4,062,747 | 12/1977 | Chang | 204/164 |
| 4,123,663 | 10/1978 | Horiike | 250/531 |
| 4,213,818 | 7/1980 | Lemons et al. | 156/643 |

FOREIGN PATENT DOCUMENTS 51-125698  11/1976  Japan .

OTHER PUBLICATIONS

Williams et al., J. Applied Phys., vol. 46, pp. 695–698 (1975).
Chang, Dig. Tech. Papers, 11th Conf. on Solid State Devices, pp. 203–204, Tokyo (1079).
Croset et al., J. Electrochem. Soc., vol. 120, pp. 526–532 (1973).
Flamm, Solid State Tech., Apr. 1979, pp. 109–116.
Hirabayashi et al., J. Electrochem. Soc., vol. 120, pp. 1595–1601 (1973).
Singh et al., J. Electrochem. Soc., vol. 125, pp. 453–461 (3–78).
Taratov et al., Trans. of Mikroelktronika, vol. 7, No. 1, pp. 53–56 1/78.
Schmidt et al., J. Electrochem. Soc., vol. 104, pp. 230–236 (1957).

*Primary Examiner*—F. Edmundson
*Attorney, Agent, or Firm*—James H. Fox; Peter V. D. Wilde

[57] ABSTRACT

The plasma growth rate of native layers, such as oxide and nitride, on silicon is enhanced by the addition of fluorine. An increase in growth rate is obtained, and the oxide growth rates on doped and undoped portions of the silicon substrate are substantially the same. The fluorine is typically added by means of a fluorinated compound, typically CF$_4$, comprising 0.01 to 5 molecular percent of the plasma. Lower substrate temperatures, typically less than 600 degrees C., may be used, resulting in less warpage of the wafer and less diffusion of dopants.

11 Claims, 3 Drawing Figures

FLUORINE ENHANCED PLASMA GROWTH OF NATIVE LAYERS ON SILICON

BACKGROUND OF THE INVENTION

1. Field of the Invention

This invention relates to the production of semiconductor devices by growing a native layer on silicon in a plasma.

2. Description of the Prior Art

In the production of semiconductor devices, including discrete devices and integrated circuits, one nearly universal step is the growth of an oxide layer on a silicon wafer. Typically, this is done on an undoped silicon wafer, or a wafer having a uniform doping level, as a prior step before subsequent selective doping operations. However, the growth of an oxide layer on silicon wafers having selectively doped regions may also be used. At the present time, the standard commercial method of oxidizing a silicon wafer, whether doped or undoped, is by heating the wafer in an oxygen atmosphere to a temperature on the order of 1100 degrees C. Occasionally, the oxidation is accomplished in a steam atmosphere. Small amounts of chlorine may be introduced in the oxidizing atmosphere to remove impurities, especially sodium, from the oxide layer. However, the elevated temperatures required for such thermal oxidation leads to a slight warpage of the silicon wafer. This can be detrimental to the production of semiconductor devices having fine line widths, as the warpage interferes with obtaining adequate resolution and alignment in subsequent lithography steps. In addition, in the case of silicon wafers that already have portions selectively doped prior to the oxidation step, the high temperatures required by oxidation cause the dopants to diffuse somewhat in the silicon wafer. This may interfere in the operation or design or semiconductor devices, particularly those having very small gate regions, as in high density MOS devices.

Recently, work has been directed towards the plasma oxidation of silicon wafers. This includes placing the wafer in an oxygen plasma, which may be either a DC plasma or an RF plasma. A DC bias field is typically applied to the wafer in order to direct electrons and ion species from the plasma towards the wafer, resulting in increased oxidation rates. The primary advantage envisioned thus far for plasma oxidation of silicon wafers is that the oxide may be formed at a much lower wafer temperature, typically on the order of 600 degrees C. See, for example, "Anodization of Silicon in RF Induced Oxygen Plasma," by H. Q. Vu et al. in the *Digest of Technical Papers of the 11th Conference on Solid State Devices*, Aug. 27-29, 1979, Tokyo, Japan. This reference states that the number of stacking faults in plasma-grown oxides is less than that for thermally grown oxides on silicon.

However, current plasma techniques require a relatively high power plasma generator. For production line use, it would very desirable to increase the oxide growth rate without proportionally increasing the power requirements of the plasma generator.

SUMMARY OF THE INVENTION

I have discovered that the addition of fluorine to a plasma atmosphere increases the rate of growth of native layers on silicon. A typical example is the growth of a native oxide layer on silicon by means of an oxygen plasma. Another example is the growth of a native layer comprising nitrogen on silicon by means of a nitrogen plasma. The fluorine is typically added by means of fluorinated compounds, with $CF_4$ gas being a typical example. I have also discovered that the fluorine-assisted plasma growth process proceeds at substantially the same rate in doped and undoped portions of a silicon substrate. The concentration of the fluorine species in the plasma is typically in the range of 0.01 to 5 percent, with the temperature of the silicon substrate typically being less than 600 degrees C.

DETAILED DESCRIPTION

The following description relates to an improved method of growing native layers on silicon by means of a plasma. I have found that the oxidation rate of silicon in an oxygen plasma can be significantly increased when fluorine is added to the oxygen plasma. The mechanism by which the fluorine assists the growth of an oxide layer can also be advantageously used to grow other native layers, including silicon nitride and silicon carbide on silicon, as discussed further below.

Figure 1:
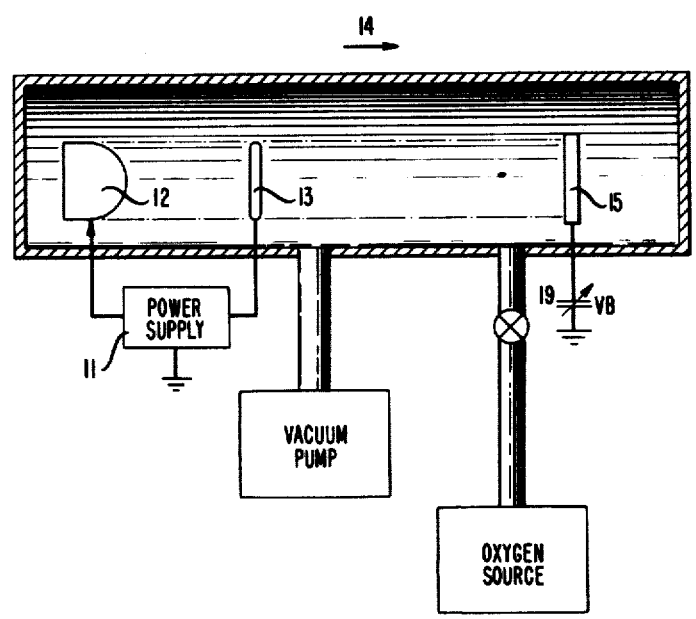
FIG. 1 is a simplified schematic of a typical plasma generator used in practicing this invention.

FIG. 1 shows a typical plasma generator used for the experiments described herein. In schematic form, power supply 11 produces a 30 MHz signal at a power level of approximately 250 watts which is coupled to electrodes 12 and 13, producing the plasma. A magnetic field (14), typically 50 to 500 gauss, and approximately 200 gauss in the present experiments, is applied along the axis of the plasma chamber to help confine the electrons and ions to the desired discharge region. The vacuum pump in the present experiments maintains the pressure at approximately $10^{-3}$ torr. The oxygen source provides a supply of oxygen atoms. The bias supply 19 maintains the substrate 15 at a given potential with respect to electrodes 12 and 13. A wide variety of plasma generators can be used in practicing the present invention. In particular, power supply 11 may be a DC power supply or may operate over a wide range of frequencies, including a typical frequency of 13.6 MHz. The arrangement of the electrodes may be different than that shown. In fact, the plasma may be produced by other means entirely, such as bombarding an oxygen atmosphere with electrons. For an example of this latter arrangement, see U.S. Pat. No. 4,062,747 assigned to the same assignee as the present invention. With the substrate biased as shown, a plasma generator such as that shown is also frequently referred to as a reactive ion etcher, as such apparatus are frequently used for etching silicon or silicon dioxide with other plasma atmospheres than that described herein.

In any case, regardless of the apparatus used, a concentration of at least $10^9$ electrons per cubic centimeter is present adjacent to the surface of substrate 15. It should be noted that the present invention is concerned with the growth of native layers on silicon, and not deposition of silicon layers. The increase in oxide growth rate due to the addition of fluorine to an oxygen plasma is illustrated by means of Example 1, following

EXAMPLE 1

Figure 2:
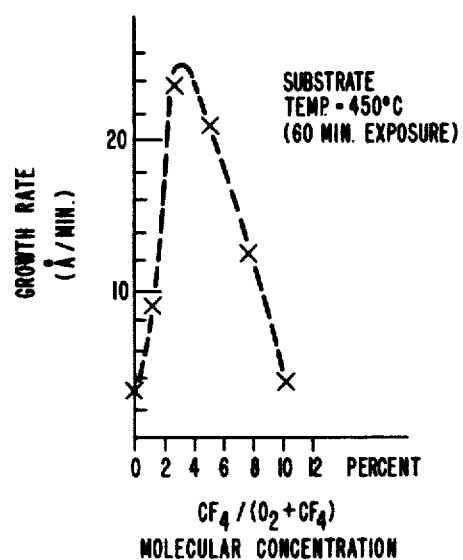
FIG. 2 is a typical graph of growth rate of silicon dioxide versus fluorine concentration.

A silicon substrate was placed inside a plasma generator such as described above. A plasma density of approximately $10^{10}$ ions per cubic centimeter over a discharge diameter of about 7.5 cm was obtained with an RF power input of 250 watts at 30 MHz. The silicon substrate was first biased at +30 volts DC with respect to the plasma-producing electrodes, which were near DC ground potential. The bias was increased to +60 volts DC as the oxide grew, to maintain an approximately constant current through the oxide layer. The oxygen pressure inside the chamber was approximately $10^{-3}$ torr. Several silicon wafers were exposed in the plasma generator to atmospheres containing given amounts of fluorine, which was added to the atmosphere by the addition of $CF_4$ gas. Each wafer was exposed for 60 minutes with the temperature of the wafers being 450 degrees C. The results of this experiment are plotted in FIG. 2.

The results of this experiment show that approximately an order of magnitude increase in growth rate can be obtained with an approximately 4 percent atmosphere of $CF_4$. The actual fluorine present in the oxide responsible for the improved growth rate is considerably less, however, typically being less than one-half percent. For example, with a 10 percent $CF_4$ atmosphere, approximately 0.6 atomic percent fluorine is present in an oxide layer 2,000 Angstroms thick that was grown with a bias voltage of +30 volts DC. Other fluorine compounds may yield different amounts of fluorine in the oxide layer for a given molecular percentage of the fluorine compound in the plasma atmosphere. Auger measurements have shown that the concentration of the fluorine incorporated in the oxide is relatively constant through most of the oxide. I postulate that the atomic concentration of fluorine in the grown native layer is of significance in determining the growth rate, and is in the range of 0.001 to 1 percent in all cases included herein. As noted above, the concentration of the fluorine source in the plasma atmosphere is greater than this. In all cases, however, the molecular percentage of the fluorine source in the plasma is less than 5 percent. This distinguishes cases wherein fluorine is used to etch a silicon or silicon dioxide layer, requiring substantially greater fluorine concentrations.

The above-observed increase of growth rate is quite significant. However, it is likely that in production, higher power levels and hence higher plasma densities will be used, resulting in still faster growth rates. At higher power levels, the amount of $CF_4$ necessary to produce maximum growth will be less than that shown in FIG. 2. A higher bias voltage on the substrate will also reduce the concentration of the fluorine species required to produce the maximum growth rate.

It should be noted that $CF_4$ was chosen as the fluorine source simply because it is convenient to work with. However, other sources have also been used effectively. Teflon (a registered trademark of E. I. Dupont, Inc., for solid, polymerized $CF_2$) can conveniently serve as a source of fluorine by simply placing the solid Teflon in the plasma generator. A certain amount of the Teflon will be vaporized, causing fluorine to be incorporated in the plasma atmosphere. Hydrogen fluoride (HF) gas, or $C_2F_6$ gas, can also be used as a source or fluorine, or fluorine gas itself may be used directly. Numerous other fluorine-containing compounds may also be used as a source of the fluorine in the plasma atmosphere. Increasing the bias voltage will increase the oxidation rate. Voltages up to approximately 100 volts can be used. However, at voltages much beyond this value the defects will increase in the oxide layer, although increases in growth rate can still be expected.

The incorporation of fluorine into the plasma atmosphere also has an unexpected beneficial effect related to doping levels. It is generally known that silicon doped with certain impurities such as phosphorus oxidizes more quickly than undoped silicon, particularly at temperatures below 1,000 C.; see, for example, "Si/SiO$_2$ Interface Oxidation Kenetics: A Physical Model for the Influence of High Substrate Doping Levels," by C. P. Ho and J. D. Plummer in the *Journal of the Electrochemical Society*, pages 1516 through 1522, September 1979. It has been found that at fluorine concentrations producing the maximum growth rate the "fluorine effect" dominates the growth process to such an extent that the difference in oxidation rates between doped and undoped regions are largely negated. This will be more fully illustrated by means of the following example

EXAMPLE 2

A first silicon substrate was doped in one region to a level of $10^{15}$ boron atoms per cubic centimeter and in another region to $10^{19}$ boron atoms per cubic centimeter (p-type doping). The substrate was then placed in a plasma atmosphere containing approximately 2 percent $CF_4$ and oxidized at 450 degrees C. as further explained above. It was found that on both the more lightly doped region and the more heavily doped region, an oxide film approximately 1,000 Angstroms thick was grown in 60 minutes. The thickness was determined by the color of the oxide layer with an accuracy of approximately 200 Angstroms. A second substrate was then doped with arsenic (n-type doping), with one region having a level of $10^{14}$ arsenic atoms per cubic centimeter and another region having an arsenic doping level of $10^{16}$ atoms per cubic centimeter. The plasma oxygen atmosphere contained approximately 2 percent $CF_4$, as above. In this case also an oxide film approximately 1,000 Angstroms thick was grown in 60 minutes on both the more lightly doped portion and the more heavily doped portion, as determined by color measurement of film thickness. Considering that both the above substrates were at a temperature of only about 450 degrees the oxide thickness was much more constant than would have occurred had there been no fluorine in the plasma.

The above observation on comparable oxide growth rates in differently doped portions can provide a useful tool for the manufacture of semiconductor devices. Considering that relatively low temperatures are involved in the plasma oxidation process, which means that the dopants will diffuse much less in the silicon wafer, new processing possibilities are opened by the incorporation of fluorine in the plasma atmosphere.

Figure 3:
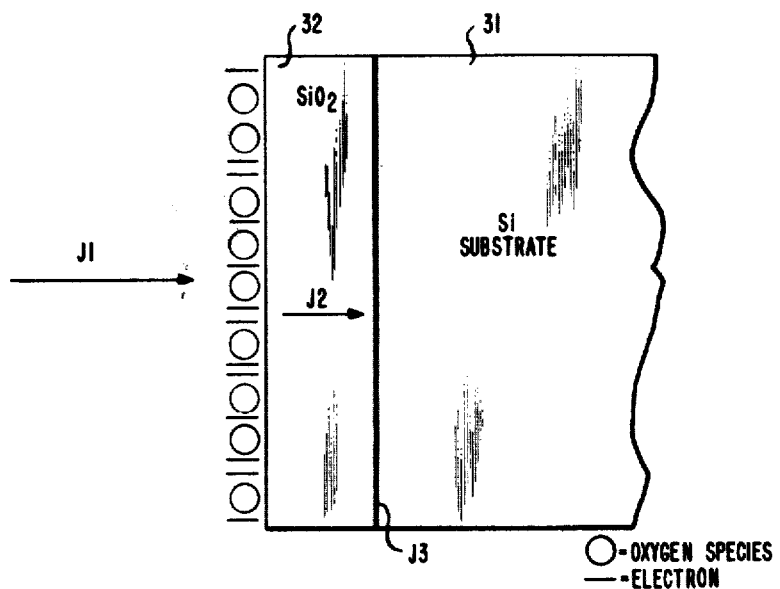
FIG. 3 shows schematically the transport processes responsible for oxide growth on silicon.

The above observations can be understood with reference to the oxide growth process as schematically illustrated in FIG. 3. $J_1$, $J_2$, and $J_3$ represent coefficients of the oxidizing process in the various media. The oxidizing species may be $O_2$, O, or an oxygen ion species, referred to collectively as "the oxygen species." $J_1$ is the flux of active oxygen species present at the surface of the oxide layer (32). The oxygen species migration through region 32 is accomplished primarily by two mechanisms. The first is described by the diffusion coefficient and increases as the temperature and oxygen species density gradient across the oxide is increased.

The second is due to the mobility of the oxygen species in the oxide layer and increases as the electric field across the oxide is increased. The sum of these two mechanisms is represented by $J_2$. It is also possible that a certain amount of silicon migrates from the interface towards the surface of the oxide layer. The third coefficient, $J_3$, represents the reaction that takes place at the interface between the silicon dioxide and the silicon substrate, and is increased as a result of the presence of the fluorine in the plasma. $J_3$ also depends upon both the temperature of the substrate and the flux of the oxygen species.

It has been found that $J_3$ is the limiting factor in plasma oxidation processes, as described above. The fluorine species helps to increase the $J_3$ coefficient by providing energy that assists in weakening the silicon bonds at the interface. This accounts for the increase in the oxidation rate. It also accounts for the fact that both lightly doped regions and heavily doped regions are oxidized at approximately the same rate. Previously, the more heavily doped portions oxidized at a higher rate because the dopant species increased $J_3$ in the heavily doped portion of the substrate. However, when the fluorine species is present in sufficiently high amounts, the weakening of the silicon bonds due to the fluorine dominates the dopant effect. Therefore, substantially the same oxidation rate is obtained over the entire silicon substrate.

It is this weakening of the Si bonds due to the presence of fluorine that also provides for increased growth rates for other native layers on silicon. For example, the growth rates of silicon nitride and silicon carbide can also be expected to increase. However, as both nitrogen and carbon are less reactive with silicon than is oxygen, their growth rates will be less for comparable plasma densities. This will be more fully illustrated for the growth of a silicon layer comprising nitrogen by the following example.

EXAMPLE 3

A first silicon substrate was placed in a nitrogen plasma produced by 250 watts of RF power as above. The nitrogen pressure was $10^{-3}$ torr, and the substrate temperature was 450 degrees C. With no fluorine present in the plasma, a layer comprising nitrogen that was less than 50 Angstroms thick was grown in 4 hours. Repeating this experiment with a second silicon substrate in a nitrogen plasma comprising 1 percent $CF_4$, a silicon layer comprising nitrogen that was approximately 200 Angstroms thick was grown in 4 hours. Repeating the above experiment with a third silicon substrate in a nitrogen plasma comprising 1 percent $CF_4$, but with a substrate temperature of 600 degrees C., a silicon layer comprising nitrogen that was approximately 1,000 Angstroms thick was grown in 4 hours. As it is difficult to completely purge the plasma generator of oxygen, these layers comprised oxygen, in addition to silicon and nitrogen. However, it was determined that more nitrogen than oxygen was in the grown films, with further increases in the nitrogen percentage likely as improved plasma techniques become available. It is believed that the growth of silicon nitride films will eventually be possible.

A certain residual amount of fluorine will remain in the grown layer following the plasma growth process. If desired, this fluorine may be substantially removed by various annealing steps such as hydrogen annealing, which is known in the art. All such variations and deviations which basically rely on the teachings through which this invention has advanced the art are properly considered to be within the spirit and the scope of this invention.

I claim:

1. A method of making a semiconductor device including the step of growing a native layer at least 50 Angstroms thick on a body comprising silicon by steps comprising exposing said body to a plasma comprising a concentration of at least $10^9$ electrons per cubic centimeter adjacent to the surface of said native layer, and placing said body at a positive electrical potential with respect to the source of said plasma, characterized in that said plasma comprises fluorine which provides for the incorporation of atomic fluorine in said native layer during said growing, with the concentration of said fluorine in said plasma being less than a concentration which produces etching of said native layer, and with said fluorine producing an increase in the growth rate of said native layer as compared to the growth rate in the absence of said fluorine.

2. The method of claim 1 further characterized in that the atomic concentration of fluorine in the native layer as grown is in the range of 0.001 to 0.5 percent.

3. The method of claim 1 further characterized in that said plasma is an oxygen plasma, and said native layer is substantially silicon dioxide.

4. The method of claim 1 further characterized in that said plasma comprises nitrogen, and said native layer comprises a compound of silicon and nitrogen.

5. The method of claims 1, 2, 3, or 4 further characterized in that the temperature of said body during said plasma exposure is less than 600 degrees C.

6. The method of claim 5 further characterized in that said body further comprises regions exposed to said plasma which differ in p-type or n-type doping levels by at least a factor of 10.

7. A semiconductor device made in accordance with the method of claim 6.

8. The method of claims 1, 2, 3, or 4 further characterized in that said fluorine comprises at least 0.01 molecular percent of said plasma.

9. The method of claim 8 further characterized in that the source of said fluorine is introduced in said plasma by means of $CF_4$.

10. The method of claim 8 further characterized in that said fluorine comprises less than 5 molecular percent of said plasma.

11. The method of claim 1 further characterized in that the increased growth rate produced by said fluorine is at least four times the growth rate in the absence of said fluorine.

* * * * *